(12) United States Patent
Fukushima et al.

(10) Patent No.: US 11,208,721 B2
(45) Date of Patent: Dec. 28, 2021

(54) SUBSTRATE PROCESSING APPARATUS

(71) Applicant: TOKYO ELECTRON LIMITED, Tokyo (JP)

(72) Inventors: Kohei Fukushima, Oshu (JP); Tsuneyuki Okabe, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 241 days.

(21) Appl. No.: 15/911,501

(22) Filed: Mar. 5, 2018

(65) Prior Publication Data

US 2018/0258528 A1 Sep. 13, 2018

(30) Foreign Application Priority Data

Mar. 7, 2017 (JP) .............................. JP2017-043235

(51) Int. Cl.
| | |
|---|---|
| *C23C 16/455* | (2006.01) |
| *C23C 16/458* | (2006.01) |
| *H01L 21/673* | (2006.01) |
| *C23C 16/44* | (2006.01) |

(Continued)

(52) U.S. Cl.
CPC .... *C23C 16/45502* (2013.01); *C23C 16/4409* (2013.01); *C23C 16/4412* (2013.01); *C23C 16/4584* (2013.01); *C23C 16/45578* (2013.01); *C23C 16/45589* (2013.01);
(Continued)

(58) Field of Classification Search
CPC ........... H01L 21/6732; H01L 21/67109; H01L 21/67253; H01L 21/68771; H01L 21/67117; H01L 21/67309; C23C 16/4412; C23C 16/45502; C23C 16/4409; C23C 16/45578; C23C 16/45589; C23C 16/4584; H01J 37/32633; H01J 37/32816; H01J 37/32834; H01J 37/321–32119; H01J 37/32513
See application file for complete search history.

(56) References Cited

U.S. PATENT DOCUMENTS 5,997,589 A * 12/1999 Tien .................... C23C 16/4412
29/25.01
6,261,408 B1 * 7/2001 Schneider ........... C23C 16/4412
118/715

(Continued)

FOREIGN PATENT DOCUMENTS

| JP | 03-169008 A | 7/1991 | |
|---|---|---|---|
| JP | H06275533 A * | 3/1993 | ........... H01L 21/205 |

(Continued)

*Primary Examiner* — Yuechuan Yu
(74) *Attorney, Agent, or Firm* — Nath, Goldberg & Meyer; Jerald L. Meyer; Tanya E. Harkins

(57) ABSTRACT

A substrate processing apparatus includes an inner tube configured to accommodate a plurality of substrates and having a first opening portion; an outer tube surrounding the inner tube; a movable wall movably provided in the inner tube or between the inner tube and the outer tube and having a second opening portion; a gas supply part configured to supply a processing gas into the inner tube; an exhaust part provided outside the movable wall and configured to exhaust the processing gas supplied into the inner tube through the first opening portion and the second opening portion; and a pressure detection part configured to detect a pressure inside the inner tube.

9 Claims, 14 Drawing Sheets

(51) Int. Cl.
*H01L 21/687* (2006.01)
*H01L 21/67* (2006.01)

(52) U.S. Cl.
CPC .. *H01L 21/67109* (2013.01); *H01L 21/67253* (2013.01); *H01L 21/67309* (2013.01); *H01L 21/68771* (2013.01)

(56) References Cited

U.S. PATENT DOCUMENTS

| | | | | |
|---|---|---|---|---|
| 2005/0287806 A1* | 12/2005 | Matsuura | .......... | C23C 16/45531 |
| | | | | 438/680 |
| 2007/0026162 A1* | 2/2007 | Wei | .......... | C23C 16/52 |
| | | | | 427/569 |
| 2011/0220089 A1* | 9/2011 | Kobayashi | .......... | H01L 21/67109 |
| | | | | 126/77 |
| 2011/0312188 A1* | 12/2011 | Wamura | .......... | C23C 16/52 |
| | | | | 438/758 |
| 2014/0051261 A1* | 2/2014 | Ota | .......... | C23C 16/45523 |
| | | | | 438/770 |
| 2015/0060404 A1* | 3/2015 | Dhindsa | .......... | H01J 37/32816 |
| | | | | 216/61 |

FOREIGN PATENT DOCUMENTS

| | | | |
|---|---|---|---|
| JP | 2002-294453 | A | 10/2002 |
| JP | 2005-64073 | A | 3/2005 |
| JP | 2008-187139 | A | 8/2008 |
| JP | 5284182 | B2 | 6/2013 |

\* cited by examiner

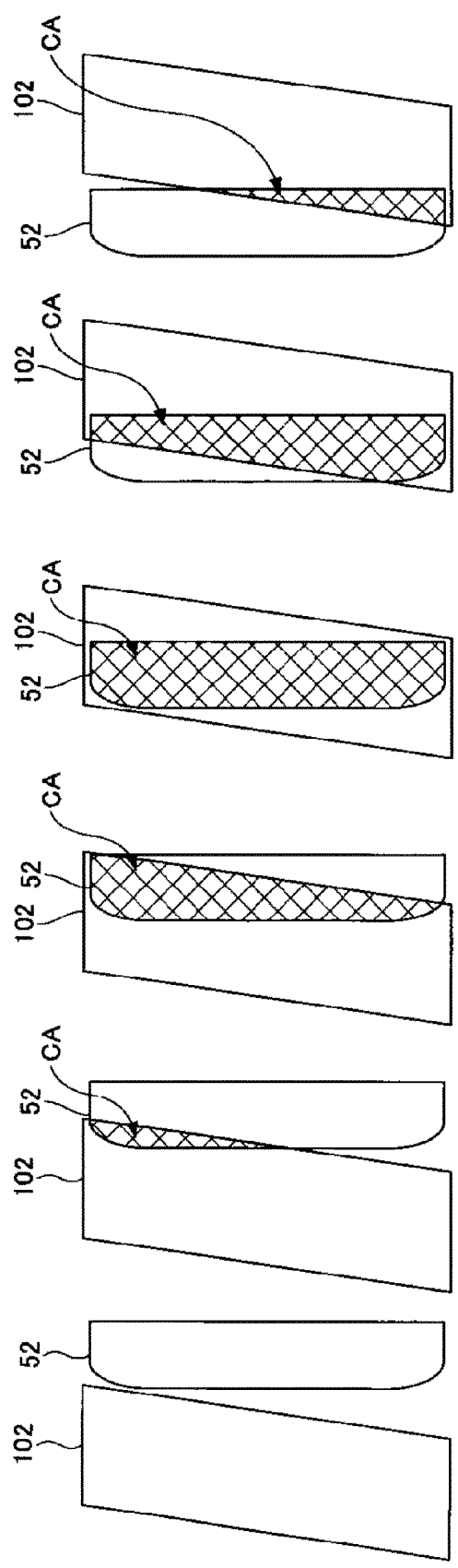

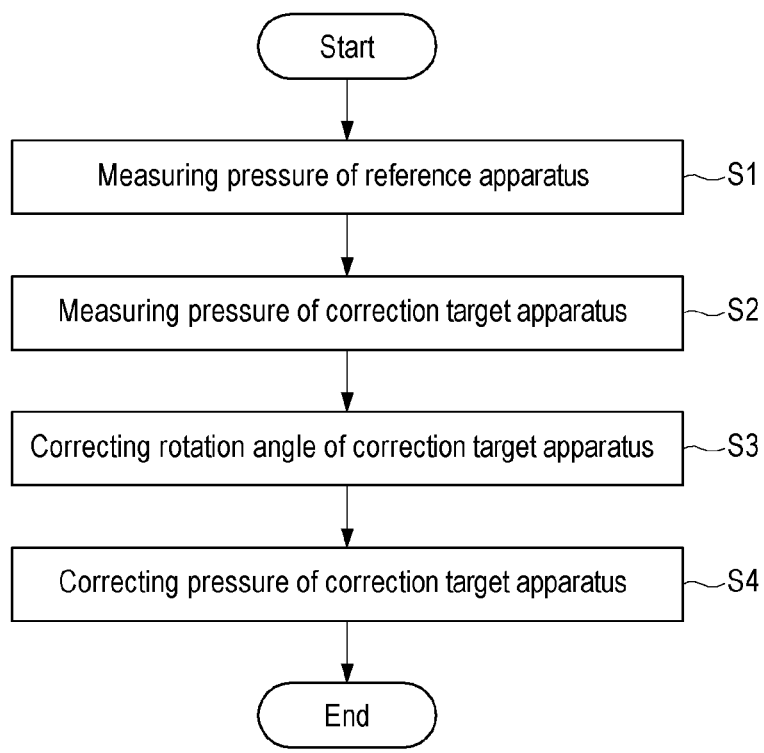

FIG. 8

| Slit Opening | First closed position | Upper exhaust position | Maximum opening position | Lower exhaust position | Second closed position |
|---|---|---|---|---|---|
| Cross section of processing container | | | | | |
| Opening area of common opening portion | | | | | |

SUBSTRATE PROCESSING APPARATUS

CROSS-REFERENCE TO RELATED APPLICATION

This application is based upon and claims the benefit of priority from Japanese Patent Application No. 2017-043235, filed on Mar. 7, 2017, the entire contents of which are incorporated herein by reference.

TECHNICAL FIELD

The present disclosure relates to a substrate processing apparatus.

BACKGROUND

A batch type substrate processing apparatus has been used that is capable of collectively processing a plurality of substrates held in multiple stages by a substrate holder.

As the batch type substrate processing apparatus, an apparatus has been used that includes an inner tube configured to accommodate a substrate, an outer tube configured to surround the inner tube, a gas exhaust port provided on a side wall of the inner tube, and an exhaust unit configured to evacuate a space interposed between the inner tube and the outer tube. In this apparatus, an opening width of the gas exhaust port is gradually narrowed toward the exhaust unit. Thus, the balance of exhaust is adjusted, and the flow velocity of the gas supplied to the surface of the substrate is made uniform among the substrates.

However, in the above-described substrate processing apparatus, the shape of the opening of the gas exhaust port is determined on an apparatus-by-apparatus basis. Therefore, desired inter-plane uniformity may not be obtained depending on the process conditions and the number of processed substrates. This is because the balance of exhaust cannot be adjusted for each process condition and the number of processed substrates.

SUMMARY

Some embodiments of the present disclosure provide a substrate processing apparatus capable of controlling inter-plane uniformity.

According to one embodiment of the present disclosure, there is provided a substrate processing apparatus including an inner tube configured to accommodate a plurality of substrates and having a first opening portion; an outer tube surrounding the inner tube; a movable wall movably provided in the inner tube or between the inner tube and the outer tube and having a second opening portion; a gas supply part configured to supply a processing gas into the inner tube; an exhaust part provided outside the movable wall and configured to exhaust the processing gas supplied into the inner tube through the first opening portion and the second opening portion; and a pressure detection part configured to detect a pressure inside the inner tube.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIGS. 6A to 6F are views for explaining a positional relationship between a first opening portion and a second opening portion.

FIG. 7 is a flowchart showing a pressure regulation method according to the first embodiment.

FIG. 8 is an explanatory view (1) of each step of the pressure regulation method according to the first embodiment.

DETAILED DESCRIPTION

Figure 1:
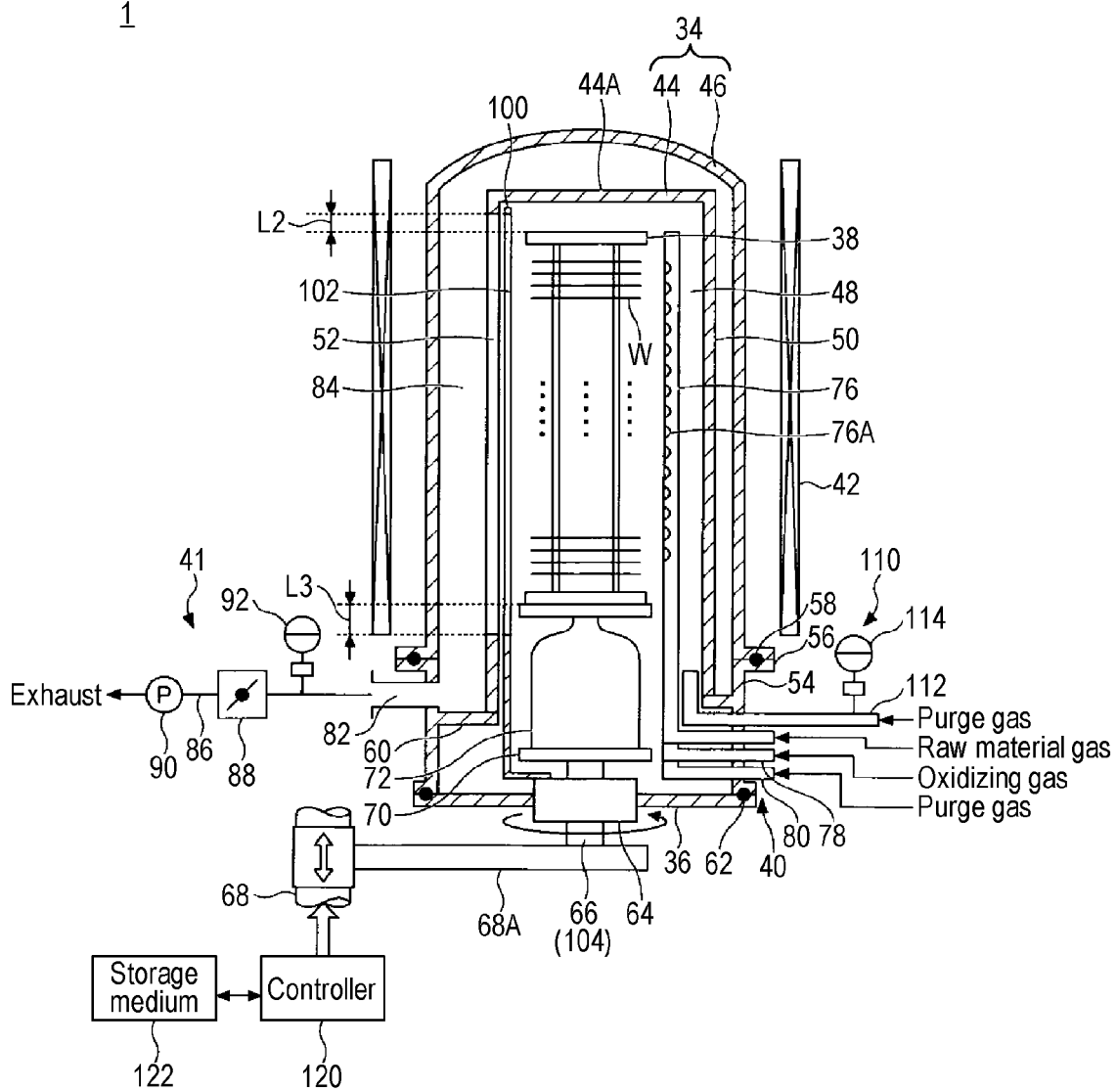
FIG. 1 is a schematic diagram of a substrate processing apparatus according to a first embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments. In the specification and the drawings, substantially the same components are denoted by the same reference numerals, and redundant descriptions are omitted.

First Embodiment (Substrate Processing Apparatus)

Figure 2:
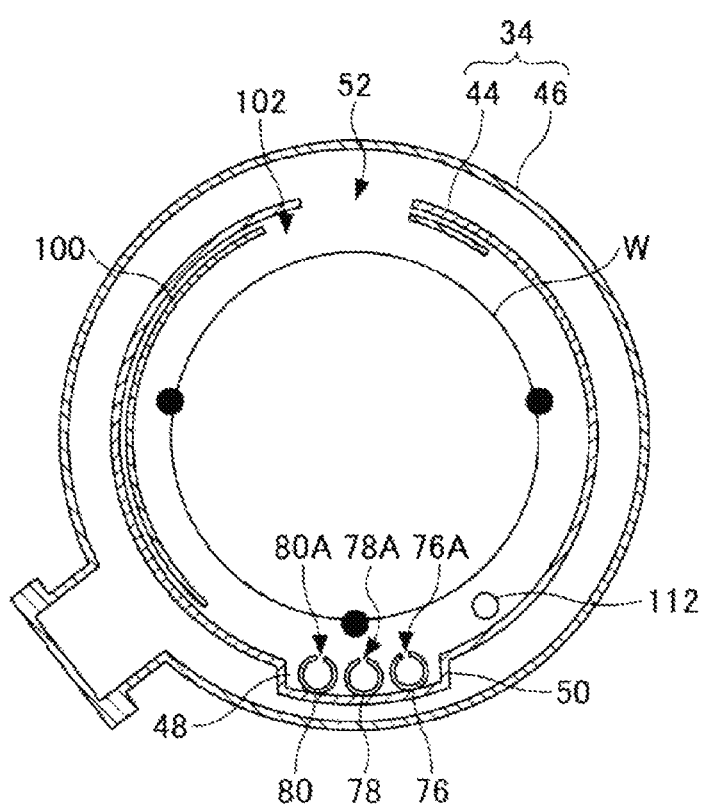
FIG. 2 is a horizontal sectional view for explaining a processing container of the substrate processing apparatus of FIG. 1.
Figure 3:
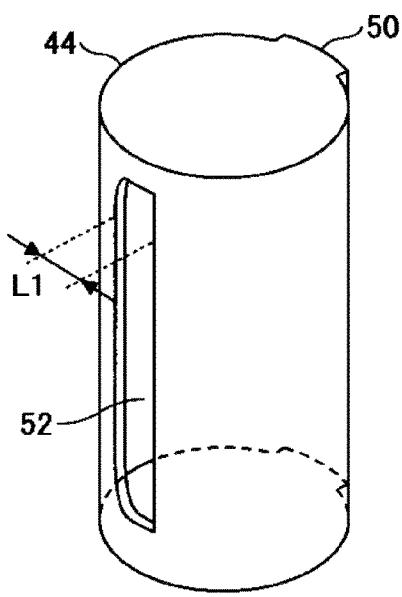
FIG. 3 is a perspective view for explaining an example of an inner tube of the substrate processing apparatus of FIG. 1.
Figure 4:
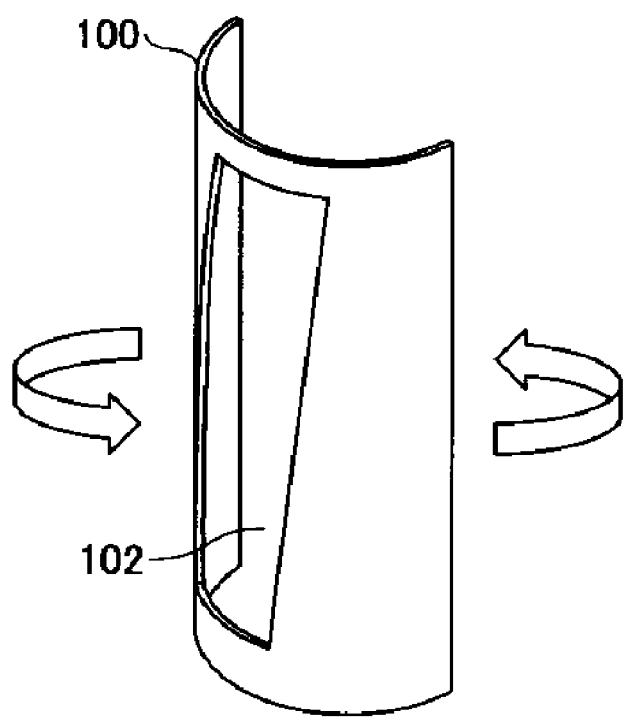
FIG. 4 is a perspective view for explaining an example of a movable wall of the substrate processing apparatus of FIG. 1.

A substrate processing apparatus according to a first embodiment of the present disclosure will be described. FIG. 1 is a schematic diagram of a substrate processing apparatus according to a first embodiment. FIG. 2 is a horizontal sectional view for explaining a processing container of the substrate processing apparatus of FIG. 1. FIG. 3 is a perspective view for explaining an example of an inner tube of the substrate processing apparatus of FIG. 1. FIG. 4 is a perspective view for explaining an example of a movable wall of the substrate processing apparatus of FIG. 1.

As shown in FIG. 1, the substrate processing apparatus 1 includes a processing container 34 capable of accommodating a semiconductor wafer (hereinafter referred to as "wafer W") as a substrate.

The processing container 34 includes a cylindrical inner tube 44 with an opened lower end and a ceiling, and a cylindrical outer tube 46 with an opened lower end and a ceiling. The cylindrical outer tube 46 covers the outer side of the inner tube 44. The inner tube 44 and the outer tube 46 are formed of a heat-resistant material such as quartz or the like and are arranged coaxially to form a double tube structure. A substrate holder 38 for holding a plurality of wafers W at predetermined intervals is loaded into and unloaded from the processing container 34.

A ceiling portion 44A of the inner tube 44 is, for example, flat. On one side of the inner tube 44, a nozzle accommodating portion 48 for accommodating gas nozzles is formed along the longitudinal direction (vertical direction). In the first embodiment, as shown in FIG. 2, a part of the side wall of the inner tube 44 is caused to protrude outward to form a convex portion 50. The inside of the convex portion 50 is formed as the nozzle accommodating portion 48.

In the side wall of the inner tube 44 opposite the nozzle accommodating portion 48, as shown in FIG. 3, a rectangular first opening portion 52 having a width L1 is formed along the longitudinal direction (vertical direction).

The first opening portion 52 is a gas exhaust port formed so as to be able to exhaust a gas existing in the inner tube 44. A length of the first opening portion 52 is equal to a length of the substrate holder 38 or larger than the length of the substrate holder 38. The first opening portion 52 is formed so as to extend in the vertical direction. That is, an upper end of the first opening portion 52 is positioned to extend to a height equal to or higher than a position corresponding to an upper end of the substrate holder 38, and a lower end of the first opening portion 52 is positioned to extend to a height equal to or lower than a position corresponding to a lower end of the substrate holder 38. Specifically, as shown in FIG. 1, a distance L2 in the height direction between the upper end of the substrate holder 38 and the upper end of the first opening portion 52 is within a range of about 0 mm to 5 mm. A distance L3 in the height direction between the lower end of the substrate holder 38 and the lower end of the first opening portion 52 is within a range of about 0 mm to 350 mm. The width L1 of the first opening portion 52 is in a range of about 10 mm to 400 mm, and in some embodiments in a range of about 40 mm to 200 mm. Two of the four corners of the first opening portion 52 are chamfered.

The lower end of the processing container 34 is supported by a cylindrical manifold 54 made of, for example, stainless steel. A flange portion 56 is formed in an upper end portion of the manifold 54. A lower end portion of the outer tube 46 is installed on, and supported by, the flange portion 56. A seal member 58 such as an O-ring or the like is interposed between the flange portion 56 and the lower end portion of the outer tube 46 so that the inside of the outer tube 46 is airtightly sealed.

An annular support portion 60 is provided on an inner wall of an upper portion of the manifold 54. A lower end portion of the inner tube 44 is installed on, and supported by, the support portion 60. A lid portion 36 is airtightly attached to an opening portion of a lower end of the manifold 54 via a sealing member 62 such as an O-ring or the like, and is configured to airtightly close an opening portion of a lower end of the processing container 34, i.e., the opening portion of the manifold 54. The lid portion 36 is formed of, for example, stainless steel.

In a central portion of the lid portion 36, a rotary shaft 66 is provided so as to penetrate the lid portion 36 through a magnetic fluid seal portion 64. The lower portion of the rotary shaft 66 is rotatably supported by an arm 68A of an elevating mechanism 68 formed of a boat elevator. The rotary shaft 66 is rotated by a motor.

A rotating plate 70 is provided at an upper end of the rotary shaft 66. The substrate holder 38 for holding the wafers W is mounted on the rotating plate 70 via a quartz-made heat insulating stand 72. Accordingly, by raising and lowering the elevating mechanism 68, the lid portion 36 and the substrate holder 38 move integrally and vertically so that the substrate holder 38 can be loaded into and unloaded from the processing container 34.

A gas supply part 40 is provided in the manifold 54 to introduce gases such as a processing gas, a purge gas and the like into the inner tube 44. The gas supply part 40 includes a plurality (three, for example) of quartz-made gas nozzles 76, 78 and 80. Each of the gas nozzles 76, 78 and 80 is provided inside the inner tube 44 to extend along the longitudinal direction of the inner tube 44. The base end portion of each of the gas nozzles 76, 78 and 80 is bent in an L-like shape and is supported to penetrate the manifold 54.

As shown in FIG. 2, the gas nozzles 76, 78 and 80 are installed in the nozzle accommodating portion 48 of the inner tube 44 in a row along the circumferential direction. In each of the gas nozzles 76, 78 and 80, a plurality of gas holes 76A, 78A and 80A is formed at predetermined intervals along the longitudinal direction of each of the gas nozzles 76, 78 and 80 so that each of the gases can be discharged in the horizontal direction from each of the gas holes 76A, 78A and 80A. For example, the predetermined intervals are set to be equal to the intervals of the wafers W supported by the substrate holder 38. In addition, the positions in the height direction of the gas holes 76A, 78A and 80A are set such that each of the gas holes 76A, 78A and 80A is positioned in the middle between the wafers W adjacent to each other in the vertical direction, whereby each of the gases can be efficiently supplied to a space between the wafers W.

A raw material gas, an oxidizing gas and a purge gas are used so that each of the gases can be supplied via each of the gas nozzles 76, 78 and 80 as needed while controlling the flow rate of each of the gases. For example, by using a silicon-containing gas as the raw material gas, an ozone gas as the oxidizing gas, and a nitrogen gas as the purge gas, a silicon oxide film can be formed by an Atomic Layer Deposition (ALD) method. The kind of gases may be appropriately selected depending on the type of the film to be formed.

A gas outlet 82 is formed in an upper side wall of the manifold 54 above the support portion 60 so as to exhaust the gas in the inner tube 44 discharged from the first opening portion 52 via a space 84 between the inner tube 44 and the outer tube 46. An exhaust part 41 is provided in the gas outlet 82. The exhaust part 41 has an exhaust passage 86 connected to the gas outlet 82. A pressure regulation valve 88 as a pressure regulation part and a vacuum pump 90 are sequentially installed in the exhaust passage 86 so that they can evacuate the inside of the processing container 34. A first vacuum gauge 92 such as a Baratron sensor or the like is provided in the exhaust passage 86 so that it can detect the pressure in the exhaust passage 86.

On an outer periphery side of the outer tube 46, a cylindrical heater 42 is provided so as to cover the outer tube 46. The heater 42 is configured to heat the wafers W.

Inside the inner tube 44, a movable wall 100 is provided along an inner wall of the inner tube 44. As shown in FIG. 4, the movable wall 100 has a semi-cylindrical shape. A second opening portion 102 is formed in a side wall of the movable wall 100.

The second opening portion 102 is a gas exhaust port formed so as to be able to exhaust the gas in the inner tube 44. For example, as shown in FIG. 4, the second opening portion 102 is different in shape from the first opening portion 52 and is formed in a parallelogram shape. For example, as shown in FIG. 1, an upper end of the second opening portion 102 is positioned to extend to a height corresponding to an upper end of the first opening portion 52. For example, as shown in FIG. 1, a lower end of the second opening portion 102 is positioned to extend to a height corresponding to a lower end of the first opening portion 52.

The movable wall 100 is provided so that a rotary shaft 104 penetrates the movable wall 100 through a magnetic fluid seal portion 64. The rotary shaft 104 is configured to be movable (rotatable) by a motor independently from the rotary shaft 66. By rotating the rotary shaft 104 and consequently rotating the movable wall 100, it is possible to change the position of the second opening portion 102 with respect to the first opening portion 52. Thus, it is possible to change the shape of a region (hereinafter referred to as "common opening portion CA") where the first opening portion 52 and the second opening portion 102 overlap with each other. As a result, it is possible to adjust the balance of exhaust of the gas existing in the inner tube 44 and to control the flow velocity of the gas supplied to the surface of the wafer W.

A pressure detection part 110 is provided in the manifold 54. The pressure detection part 110 has a sensor tube 112 made of quartz. One end of the sensor tube 112 communicates with the inside of the inner tube 44. The sensor tube 112 is provided in the inner tube 44 along the longitudinal direction thereof. The base end portion of the sensor tube 112 is bent in an L-like shape and is supported to penetrate the manifold 54. A second vacuum gauge 114 such as a Baratron sensor or the like for detecting the pressure in the sensor tube 112 is attached to the sensor tube 112 so that the second vacuum gauge 114 can detect the pressure inside the sensor tube 112. In the illustrated example, since the tip of the sensor tube 112 is located in the lower portion of the inner tube 44, it is possible to detect the pressure in the lower portion inside the inner tube 44. Alternatively, the tip of the sensor tube 112 may be located in the central portion inside the inner tube 44 or may be located in the upper portion inside the inner tube 44.

In some embodiments, a gas such as a purge gas or the like can flow through the sensor tube 112. By allowing a gas such as a purge gas or the like to flow through the sensor tube 112, it is possible to prevent deposits from adhering to the inside of the sensor tube 112. Further, in some embodiments a gas such as a purge gas or the like flowing through the sensor tube 112 has a constant flow rate. By making the flow rate constant, the ratio of the pressure inside the inner tube 44 to the pressure inside the sensor tube 112 becomes constant. Thus, by measuring the relationship between the pressure inside the inner tube 44 and the pressure inside the sensor tube 112 in advance, it is possible to detect the pressure inside the inner tube 44 with high accuracy.

Returning to FIG. 1, the overall operation of the substrate processing apparatus 1 configured in this way is controlled by a controller 120 formed of, for example, a computer or the like. The program of the computer that performs this operation is stored in, for example, a storage medium 122. The storage medium 122 may be, for example, a flexible disk, a compact disk, a hard disk, a flash memory, a DVD or the like.

The controller 120 controls the pressure regulation valve 88 and the movable wall 100 based on the pressure inside the inner tube 44 detected by the pressure detection part 110.

When the relationship between the rotation angle of the movable wall 100 and the pressure inside the inner tube 44 is different from a predetermined relationship between the rotation angle of the movable wall 100 and the pressure inside the inner tube 44, the controller 120 corrects the relationship between the rotation angle of the movable wall 100 and the pressure inside the inner tube 44 so as to come close to the predetermined relationship.

The predetermined relationship between the rotation angle of the movable wall 100 and the pressure inside the inner tube 44 may be a relationship between a rotation angle of a movable wall and a pressure inside an inner tube, which are acquired by a substrate processing apparatus (hereinafter also referred to as "reference apparatus") different from the substrate processing apparatus 1. Thus, the controller 120 can bring the relationship between the rotation angle of the movable wall 100 and the pressure inside the inner tube 44 of the substrate processing apparatus 1 to coincide with the relationship between the rotation angle of the movable wall 100 and the pressure inside the inner tube 44 of the reference apparatus. As a result, it is possible to reduce differences among machines (variation among apparatuses). The predetermined relationship between the rotation angle of the movable wall 100 and the pressure inside the inner tube 44 may be stored in, for example, a storage medium 122. Further, when the controller 120 is connected to a communication network, the predetermined relationship between the rotation angle of the movable wall 100 and the pressure inside the inner tube 44 may be stored in another substrate processing apparatus, a host computer or the like connected via the communication network.

More specifically, for example, if the position of the movable wall 100 when the pressure inside the inner tube 44 detected by the pressure detection part 110 changes from a substantially constant value to a decreasing value or an increasing value is different from a predetermined first position, the controller 120 corrects the position of the movable wall 100 when the pressure inside the inner tube 44 changes from the substantially constant value to the decreasing value or the increasing value, so as to come close to the first position. The first position may be, for example, the position of the movable wall 100 when the pressure inside the inner tube 44 changes from the substantially constant value to the decreasing value or the increasing value in the reference apparatus.

Further, for example, if the pressure inside the inner tube 44 when the movable wall 100 is in a second position is different from a predetermined second pressure, the controller 120 corrects the pressure inside the inner tube 44 when the movable wall 100 is in the second position, so as to come close to the second pressure. The second pressure may be, for example, a pressure inside the inner tube when the movable wall is in the second position in the reference apparatus. The second position may be, for example, a position where the common opening portion CA is the largest or smallest.

Figure 5A:
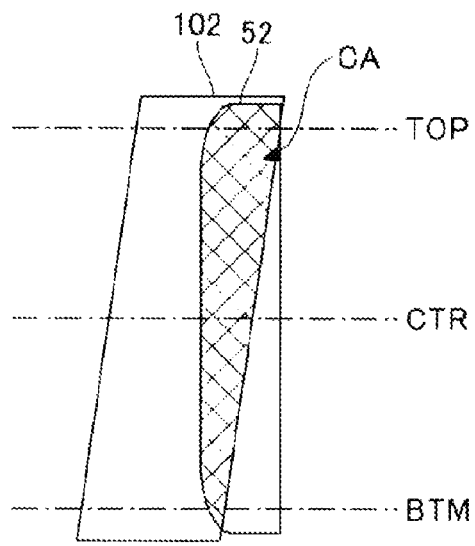
FIGS. 5A to 5D are views for explaining a common opening portion.
Figure 5B:
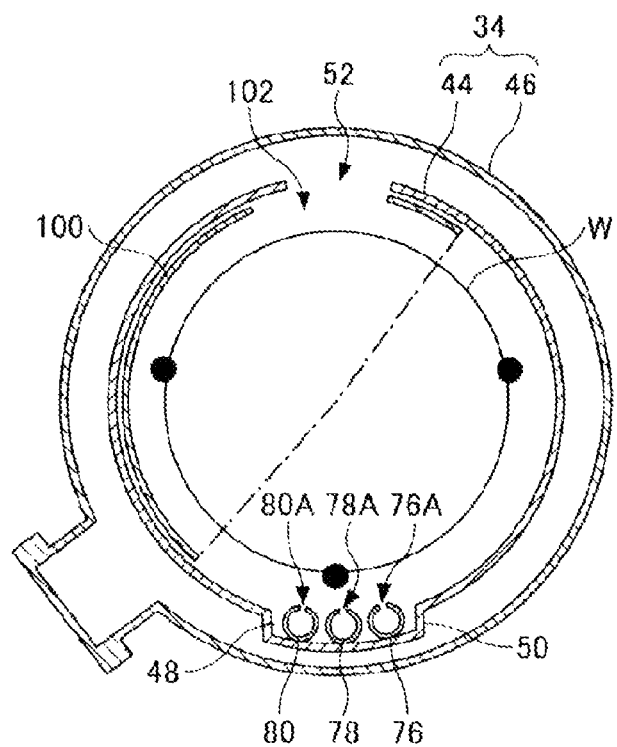
Figure 5C:
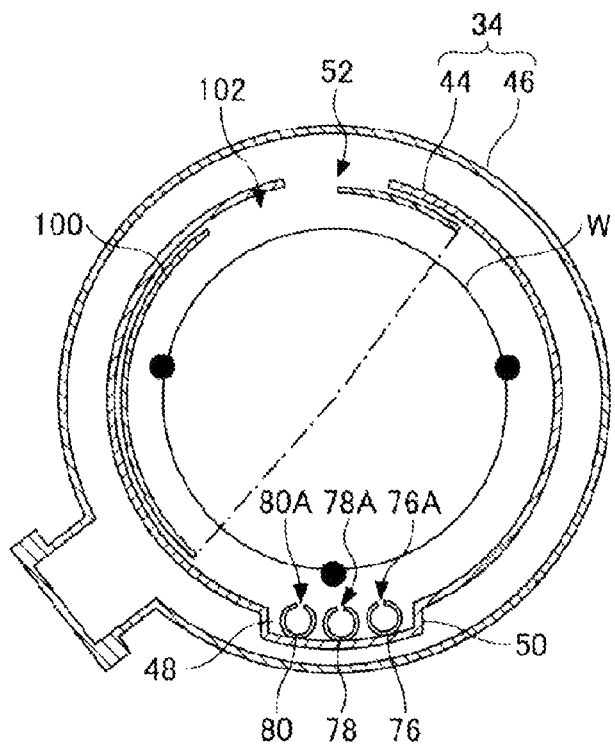
Figure 5D:
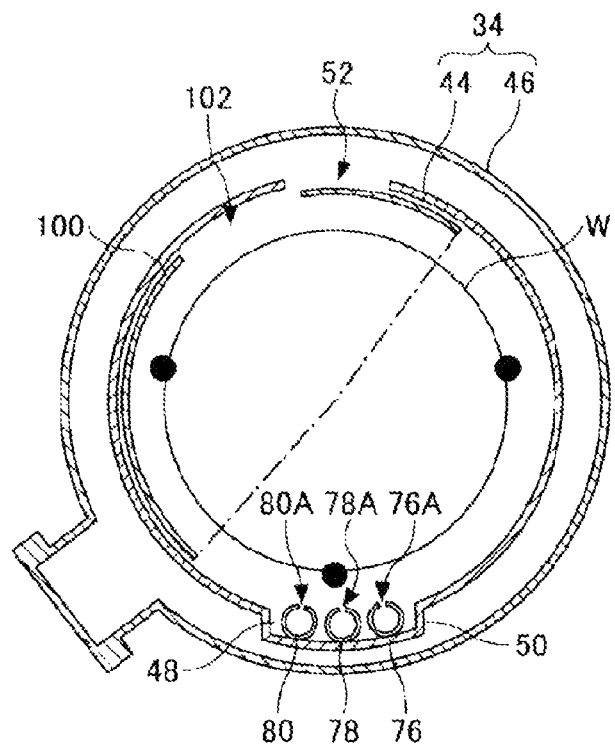

FIGS. 5A to 5D are views for explaining the common opening portion CA. FIG. 5A is a view for explaining the common opening portion CA in the case where a part of the second opening portion 102 overlaps with the first opening portion 52. FIG. 5B is a horizontal sectional view of the processing container 34 taken at the position indicated by "TOP" in FIG. 5A. FIG. 5C is a horizontal sectional view of the processing container 34 taken at the position indicated by "CTR" in FIG. 5A. FIG. 5D is a horizontal sectional view of the processing container 34 taken at the position indicated by "BTM" in FIG. 5A. "TOP" indicates the position on the upper side of the processing container 34, "CTR" indicates the position of the central portion of the processing container 34, and "BTM" indicates the position on the lower side of the processing container 34.

As shown in FIG. 5A, when the movable wall 100 is positioned such that a part of the second opening portion 102 overlaps with the first opening portion 52, the opening width of the common opening portion CA is narrowed from the TOP side toward the BTM side.

Specifically, at the position of "TOP," as shown in FIG. 5B, the second opening portion 102 completely overlaps the first opening portion 52. Therefore, the opening width of the common opening portion CA is equal to the width of the first opening portion 52. At the position of "CTR," as shown in FIG. 5C, a part of the second opening portion 102 overlaps with the first opening portion 52. Therefore, the opening width of the common opening portion CA is equal to the width of the region where the first opening portion 52 and the second opening portion 102 overlap with each other, and is smaller than the opening width of the common opening portion CA at the position of "TOP." At the position of "BTM," as shown in FIG. 5D, a very small part of the second opening portion 102 overlaps with the first opening portion 52. Therefore, the opening width of the common opening portion CA is equal to the width of the region where the first opening portion 52 and the second opening portion 102 overlap with each other, and is smaller than the opening width of the common opening portion CA at the position of "CTR." In this way, the opening width of the common opening portion CA is narrowed from the TOP side toward the BTM side.

FIGS. 6A to 6F are views for explaining the positional relationship between the first opening portion 52 and the second opening portion 102. FIGS. 6A to 6F show a change in the shape of the common opening portion CA when the position of the second opening portion 102 relative to the first opening portion 52 is changed by moving (rotating) the movable wall 100.

As shown in FIGS. 6A to 6F, by rotating the movable wall 100, it is possible to change the shape of the common opening portion CA.

In FIG. 6A, the first opening portion 52 and the second opening portion 102 do not overlap at all, and the opening area of the common opening portion CA is zero. As a result, the gas existing in the inner tube 44 is not exhausted or almost not exhausted.

In FIG. 6B, on the upper side of the first opening portion 52, the first opening portion 52 and the second opening portion 102 overlap with each other. On the other hand, on the lower side of the first opening portion 52, the first opening portion 52 and the second opening portion 102 do not overlap with each other. As a result, the gas existing in the inner tube 44 is selectively exhausted from the upper side of the first opening portion 52 without being exhausted from the lower side of the first opening portion 52.

In FIG. 6C, the first opening portion 52 and the second opening portion 102 overlap with each other on the upper side and the lower side of the first opening portion 52, and the overlapping width thereof is larger on the upper side of the first opening portion 52 than on the lower side of the first opening portion 52. As a result, the gas existing in the inner tube 44 is more easily discharged from the upper side of the first opening portion 52 than from the lower side of the first opening portion 52.

In FIG. 6D, the second opening portion 102 completely overlaps with the first opening portion 52. As a result, the gas existing in the inner tube 44 is exhausted from the entirety of the first opening portion 52.

In FIG. 6E, the first opening portion 52 and the second opening portion 102 overlap with each other on the upper side and the lower side of the first opening portion 52, and the overlapping width thereof is larger on the lower side of the first opening portion 52 than on the upper side of the first opening portion 52. As a result, the gas existing in the inner tube 44 is more easily exhausted from the lower side of the first opening portion 52 than from the upper side of the first opening portion 52.

In FIG. 6F, on the lower side of the first opening portion 52, the first opening portion 52 and the second opening portion 102 overlap with each other. On the other hand, on the upper side of the first opening portion 52, the first opening portion 52 and the second opening portion 102 do not overlap with each other. As a result, the gas existing in the inner tube 44 is selectively exhausted from the lower side of the first opening portion 52 without being exhausted from the upper side of the first opening portion 52.

In this manner, by rotating the movable wall 100, it is possible to change the shape of the common opening CA. Thus, by moving the position of the movable wall 100 in conformity with the change in the processing conditions and the number of processed substrates, it is possible to adjust the exhaust balance according to the process conditions and the number of processed substrates. As a result, it is possible to obtain a desired inter-plane uniformity.

Incidentally, the substrate processing apparatus 1 of the first embodiment includes the pressure detection part 110 for detecting the pressure inside the inner tube 44, separately from the first vacuum gauge 92 for detecting the pressure inside the exhaust passage 86. The reason is as follows.

When the conductance of the flow path extending from the inside of the inner tube 44 to the inside of the exhaust passage 86 does not change, the ratio of the pressure inside the inner tube 44 to the pressure inside the exhaust passage 86 becomes a constant value. Therefore, if the ratio of the pressure inside the inner tube 44 to the pressure inside the exhaust passage 86 is measured in advance, the pressure inside the inner tube 44 can be obtained by measuring the pressure inside the exhaust passage 86.

However, in the case where the movable wall 100 is provided along the inner wall of the inner tube 44, the shape of the common opening portion CA is changed according to the rotation angle of the movable wall 100, and the conductance of the flow path extending from the inside of the inner tube 44 to the inside of the exhaust passage 86 via the common opening portion CA is changed. Therefore, the ratio of the pressure inside the inner tube 44 to the pressure inside the exhaust passage 86 is changed. Even if the pressure in the exhaust passage 86 is measured, it is impossible to accurately obtain the pressure inside the inner tube 44.

Therefore, the substrate processing apparatus 1 according to the first embodiment is provided with the pressure detection part 110 capable of detecting the pressure inside the inner tube 44. As a result, it is possible to directly detect the pressure fluctuation in the inner tube 44. Therefore, even when the ratio of the pressure inside the inner tube 44 to the pressure inside the exhaust passage 86 is changed, it is possible to detect the pressure inside the inner tube 44 with high accuracy.

(Pressure Regulation Method)

An example of a pressure regulation method using the substrate processing apparatus 1 will be described. Hereinafter, descriptions will be made by way of example on a case where the relationship between the rotation angle of the movable wall 100 and the pressure inside the inner tube 44 of the substrate processing apparatus 1 (hereinafter also referred to as "correction target apparatus 1") is brought into corresponding relationship between the rotation angle of a movable wall 100R and the pressure inside an inner tube 44R of another substrate processing apparatus 1 (hereinafter referred to as "reference apparatus 1R").

FIG. 7 is a flowchart showing the pressure regulation method according to the first embodiment. FIGS. 8 to 13 are explanatory views of each step of the pressure regulation method according to the first embodiment. FIG. 8 shows the positional relationship between a first opening portion 52R and a second opening portion 102R in the reference apparatus 1R. FIGS. 9 to 13 show the relationship between the rotation angles of the movable walls 100 and 100R and the pressures in the inner tubes 44 and 44R. In FIGS. 9 to 13, the horizontal axis indicates the rotation angles of the movable walls 100 and 100R, and the vertical axis indicates the pressures inside the inner tubes 44 and 44R.

First, the pressure of the reference apparatus 1R is measured (step S1). Specifically, while rotating the movable wall 100R of the reference apparatus 1R, the pressure inside the inner tube 44R is detected by the pressure detection part. Thus, it is possible to acquire the relationship between the rotation angle of the movable wall 100R and the pressure inside the inner tube 44R in the reference apparatus 1R. The relationship between the rotation angle of the movable wall 100R and the pressure inside the inner tube 44R is stored in, for example, a storage medium.

Figure 9:
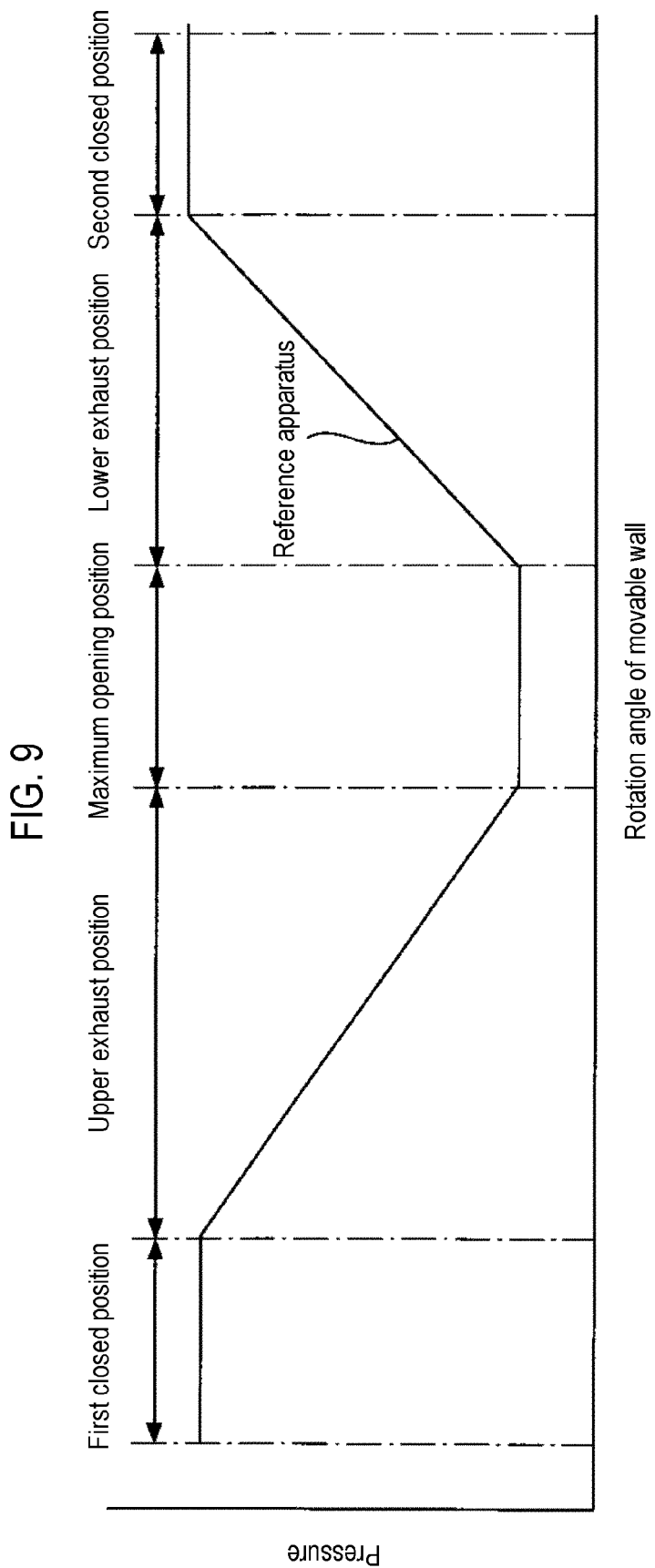
FIG. 9 is an explanatory view (2) of each step of the pressure regulation method according to the first embodiment.

FIG. 8 shows the relationship between the first opening portion 52R and the second opening portion 102R in the case where the movable wall 100R is in the first closed position, the upper exhaust position, the maximum opening position, the lower exhaust position and the second closed position. FIG. 9 shows the relationship between the rotation angle of the movable wall 100R and the pressure inside the inner tube 44R when the pressure inside the inner tube 44R is measured by the pressure detection part while rotating the movable wall 100R in the order of the first closed position, the upper exhaust position, the maximum opening position, the lower exhaust position and the second closed position.

As shown in FIG. 8, the first closed position is a position available when the first opening portion 52R and the second opening portion 102R do not overlap with each other. Therefore, at the first closed position, almost no gas is exhausted from the inner tube 44R. Thus, the pressure inside the inner tube 44 becomes the highest as shown in FIG. 9.

As shown in FIG. 8, the upper exhaust position is a position where the overlap between the first opening portion 52R and the second opening portion 102R increases on the upper side and decreases on the lower side. Therefore, at the upper exhaust position, as shown in FIG. 9, the pressure inside the inner tube 44R is lower than that at the first closed position and is higher than that at the maximum opening position.

Further, as shown in FIG. 8, the maximum opening position is a position available when the second opening portion 102R completely overlaps with the first opening portion 52R. Therefore, at the maximum opening position, the gas existing in the inner tube 44R is most easily exhausted. Thus, the pressure inside the inner tube 44 becomes the lowest as shown in FIG. 9.

Further, as shown in FIG. 8, the lower exhaust position is a position where the overlap between the first opening portion 52R and the second opening portion 102R increases on the lower side and decreases on the upper side. Therefore, at the lower exhaust position, as shown in FIG. 9, the pressure inside the inner tube 44R is lower than that at the first closed position and is higher than that at the maximum opening position.

Further, as shown in FIG. 8, the second closed position is a position available when the first opening portion 52R and the second opening portion 102R do not overlap with each other. Therefore, at the second closed position, similar to the first closed position, the gas existing in the inner tube 44R is hardly exhausted. Thus, the pressure inside the inner tube 44 becomes the highest as shown in FIG. 9.

Subsequently, the pressure of the correction target apparatus 1 is measured (step S2). Specifically, similar to the case of the reference apparatus 1R, the pressure inside the inner tube 44 is detected by the pressure detection part 110 while rotating the movable wall 100 of the correction target apparatus 1. This makes it possible to acquire the relationship between the rotation angle of the movable wall 100 and the pressure inside the inner tube 44 in the correction target apparatus 1. The relationship between the rotation angle of the movable wall 100 and the pressure inside the inner tube 44 is stored in, for example, the storage medium 122.

Figure 10:
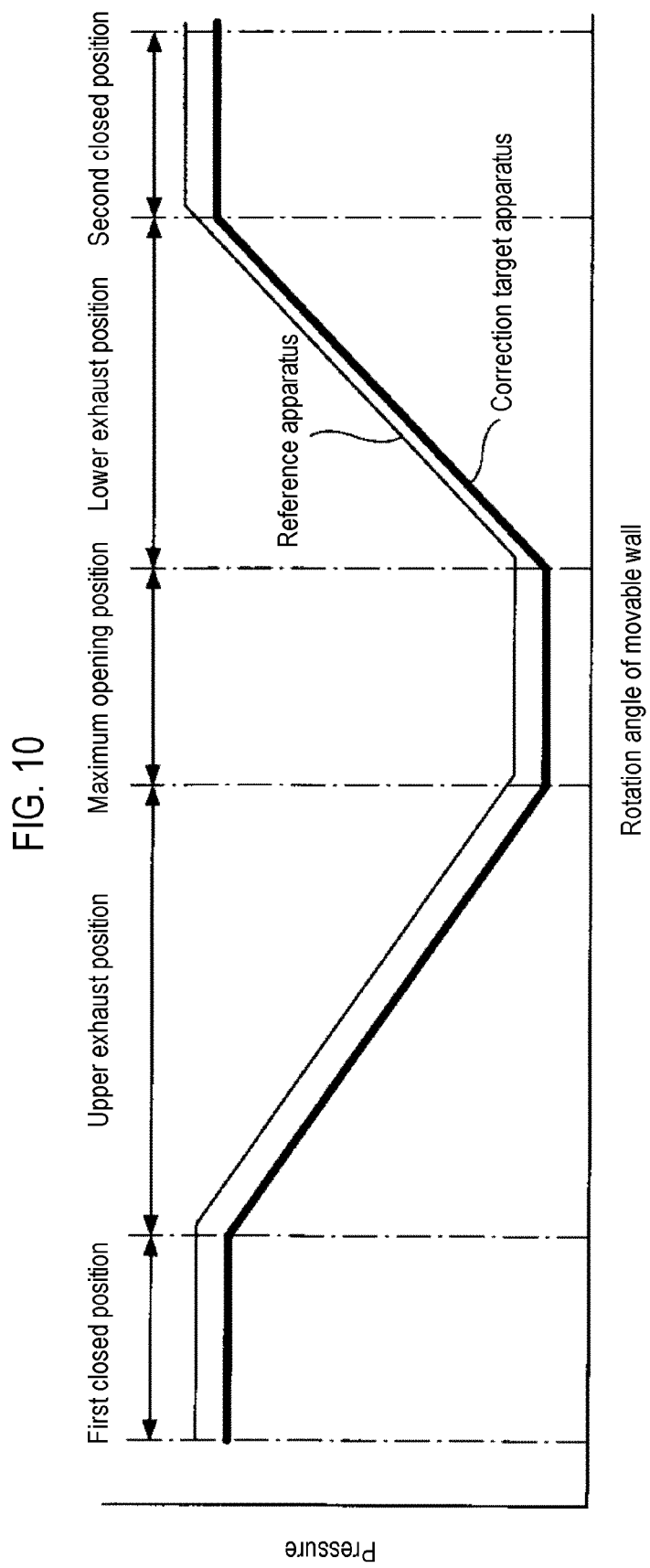
FIG. 10 is an explanatory view (3) of each step of the pressure regulation method according to the first embodiment.

FIG. 10 shows the relationship between the rotation angle of the movable wall 100 and the pressure inside the inner tube 44 when the pressure inside the inner tube 44 is detected by the pressure detection part 110 while rotating the movable wall 100 in the order of the first closed position, the upper exhaust position, the maximum opening position, the lower exhaust position and the second closed position. In FIG. 10, the thick solid line indicates the relationship between the rotation angle of the movable wall 100 and the pressure inside the inner tube 44 in the correction target apparatus 1, and the thin solid line indicates the relationship between the rotation angle of the movable wall 100R and the pressure inside the inner tube 44R in the reference apparatus 1R. As shown in FIG. 10, the relationship between the rotation angle of the movable wall 100 and the pressure inside the inner tube 44 in the correction target apparatus 1 does not coincide with the relationship between the rotation angle of the movable wall 100R and the pressure inside the inner tube 44R in the reference apparatus 1R.

Figure 11:
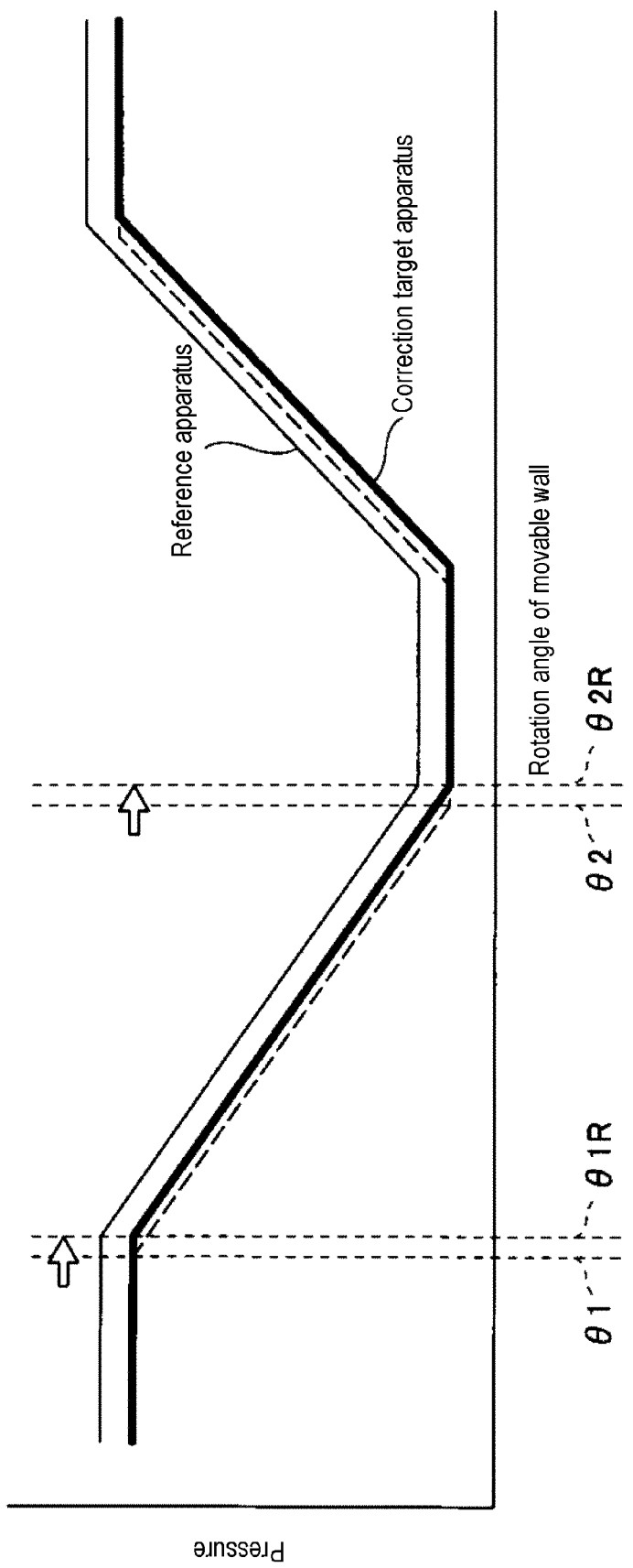
FIG. 11 is an explanatory view (4) of each step of the pressure regulation method according to the first embodiment.

Subsequently, the rotation angle of the correction target apparatus 1 is corrected (step S3). Specifically, as shown in FIG. 11, if the rotation angle θ1 of the movable wall 100 when the pressure inside the inner tube 44 of the correction target apparatus 1 changes from a substantially constant value to a decreasing value is different from the rotation angle θ1R of the movable wall 100R when the pressure inside the inner tube 44R of the reference apparatus 1 changes from a substantially constant value to a decreasing value, the controller 120 corrects the rotation angle θ1 so as to come close to the rotation angle θ1R, for example, by rotating the movable wall 100. Furthermore, if the rotation angle θ2 of the movable wall 100 when the pressure inside the inner tube 44 of the correction target apparatus 1 changes from a decreasing value to a substantially constant value is different from the rotation angle θ2R of the movable wall 100R when the pressure inside the inner tube 44R of the reference apparatus 1R changes from a decreasing value to a substantially constant value, the controller 120 corrects the rotation angle θ2 so as to come close to the rotation angle θ2R, for example, by rotating the movable wall 100. Thus, the rotation angle of the movable wall 100 when the pressure inside the inner tube 44 changes in the correction target apparatus 1 can be brought into coincidence with the rotation angle of the movable wall 100R when the pressure inside the inner tube 44R changes in the reference apparatus 1R.

Figure 12:
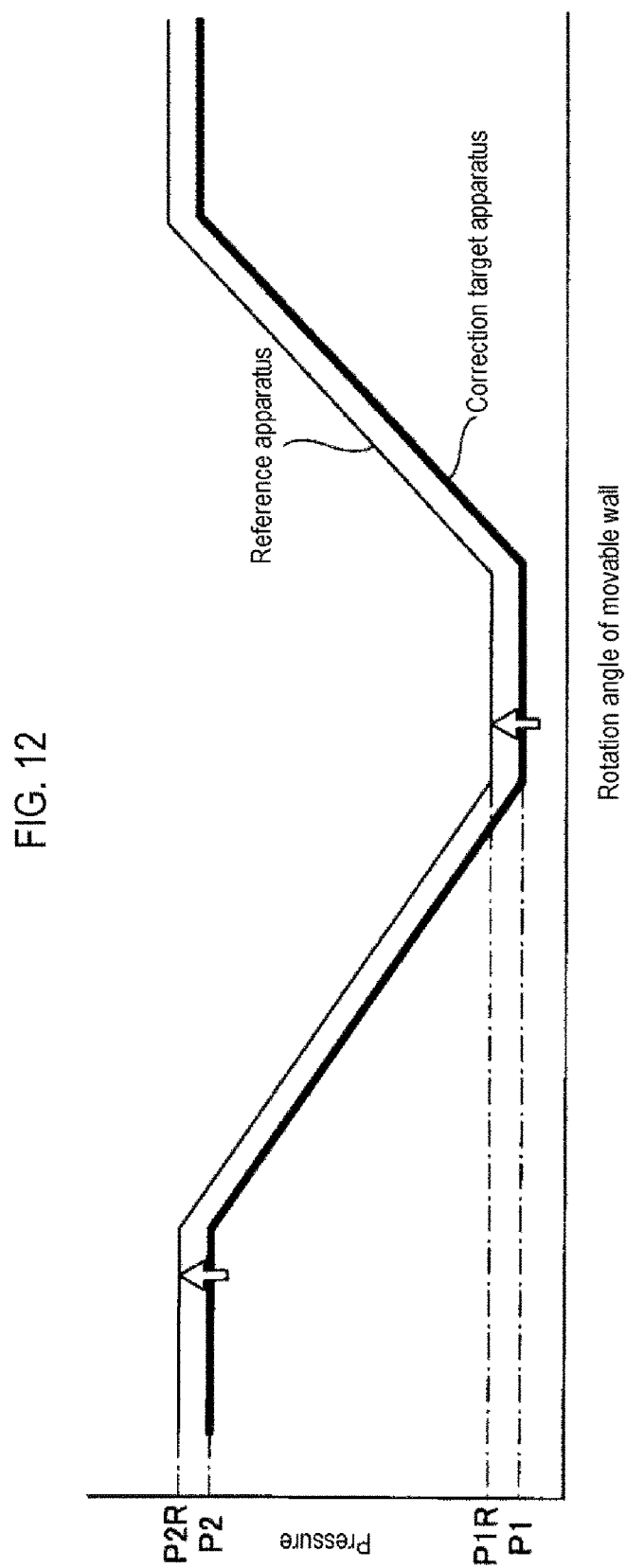
FIG. 12 is an explanatory view (5) of each step of the pressure regulation method according to the first embodiment.

Subsequently, the pressure of the correction target apparatus 1 is corrected (step S4). Specifically, the controller 120 corrects the pressure inside the inner tube 44 of the correction target apparatus 1 so as to come close to the pressure inside the inner tube 44R of the reference apparatus 1R. For example, as shown in FIG. 12, if the pressure P1 inside the inner tube 44 when the movable wall 100 of the correction target apparatus 1 lies at the maximum opening position is different from the pressure P1R inside the inner tube 44R when the movable wall 100R of the reference apparatus 1R lies at the maximum opening position, the controller 120 corrects the pressure P1 so as to come close to the pressure P1R. Furthermore, if the pressure P2 inside the inner tube 44 when the movable wall 100 of the correction target apparatus 1 lies at the closed position is different from the pressure P2R inside the inner tube 44R when the movable wall 100R of the reference apparatus 1R lies at the closed position, the controller 120 corrects the pressure P2 so as to come close to the pressure P2R. Specifically, the pressure P1 (P2) can be brought close to the pressure P1R (P2R) by reducing the opening degree of the pressure regulation valve 88 of the correction target apparatus 1. Further, the pressure P1 (P2) can be brought close to the pressure P1R (P2R) by decreasing the rotation speed of the vacuum pump 90 of the correction target apparatus 1. Furthermore, the controller 120 corrects, by linear interpolation, the pressure inside the inner tube 44 when the movable wall 100 of the correction target apparatus 1 lies at the upper exhaust position and the lower exhaust position, based on the difference between the pressure P1 and the pressure P1R and the difference between the pressure P2 and the pressure P2R.

Figure 13:
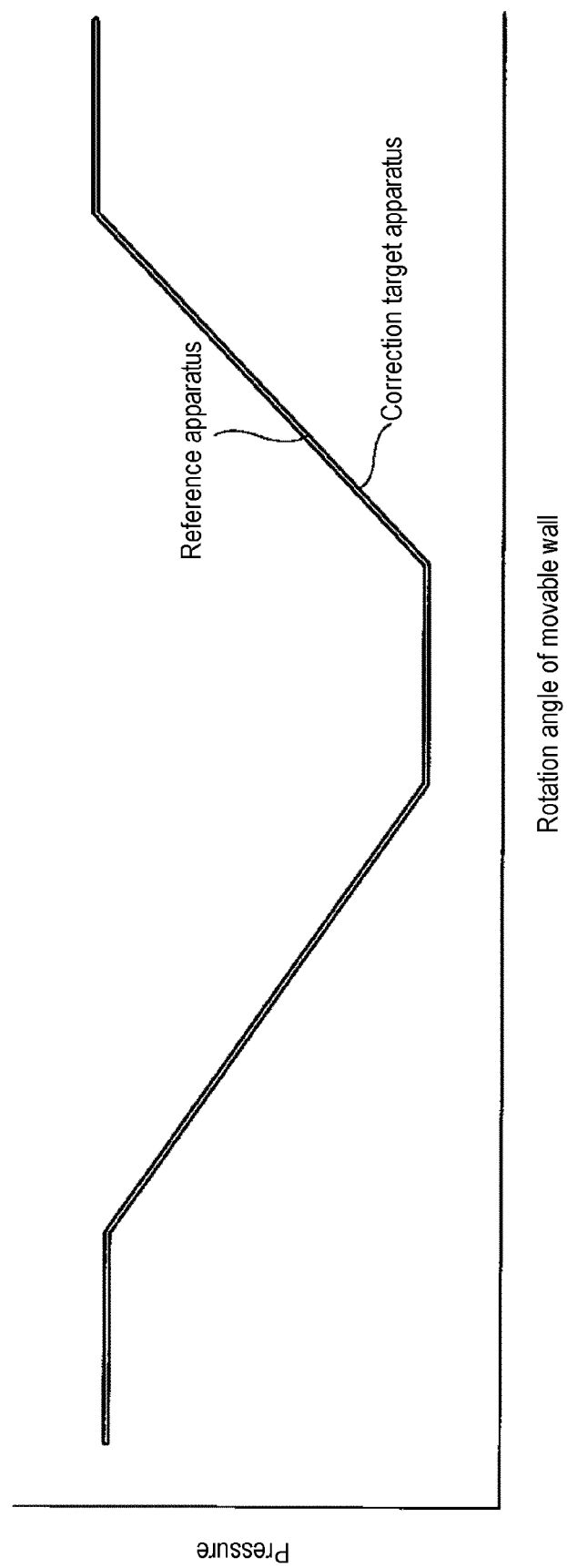
FIG. 13 is an explanatory view (6) of each step of the pressure regulation method according to the first embodiment.

By performing steps S1 to S4 in this way, as shown in FIG. 13, it is possible to bring the relationship between the rotation angle of the movable wall 100 and the pressure inside the inner tube 44 in the correction target apparatus 1 into corresponding relationship between the rotation angle of the movable wall 100R and the pressure inside the inner tube 44R in the reference apparatus 1R. As a result, it is possible to reduce differences among machines (variation among apparatuses).

Second Embodiment

Figure 14:
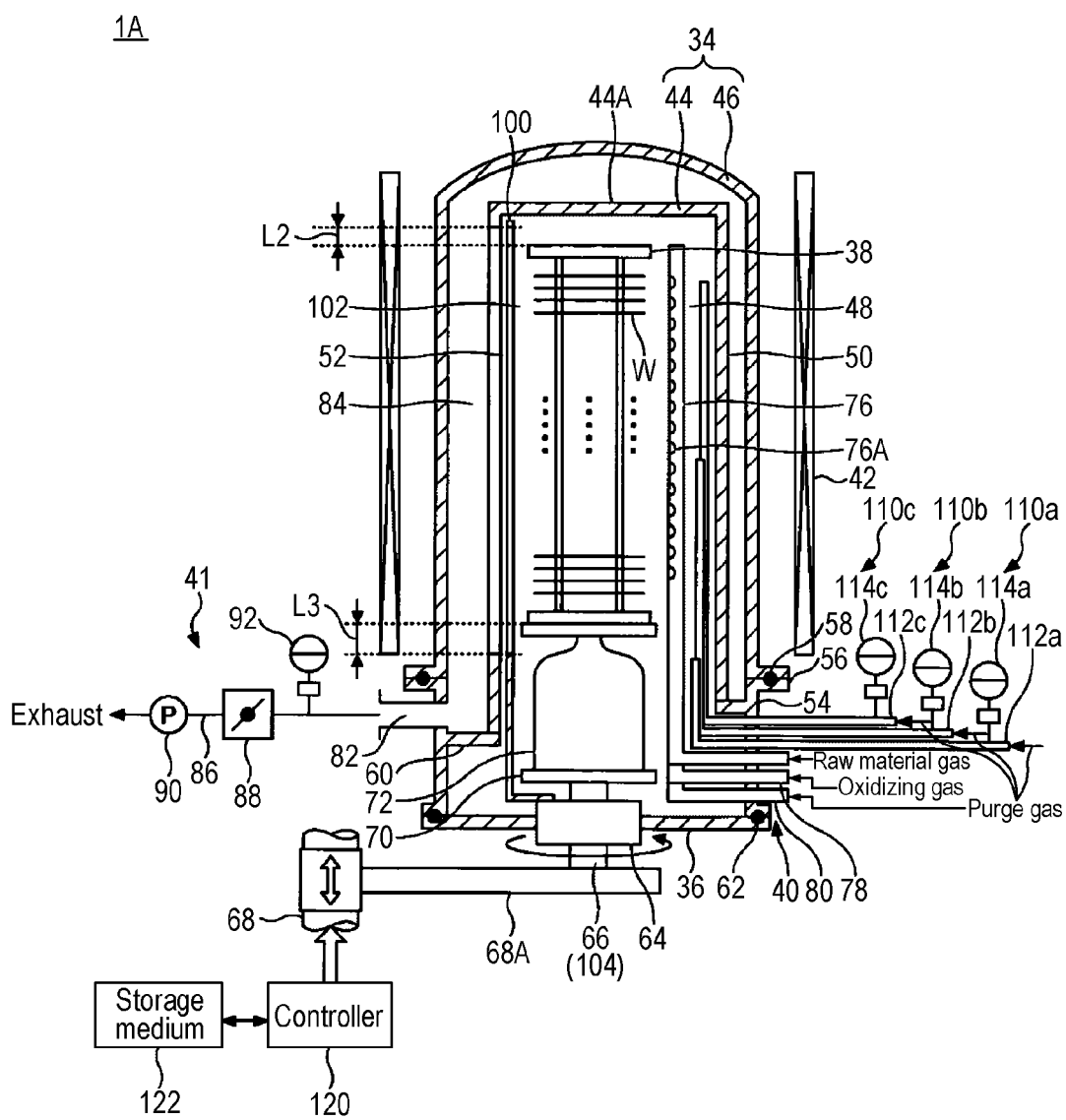
FIG. 14 is a schematic diagram of a substrate processing apparatus according to a second embodiment.

A substrate processing apparatus according to a second embodiment of the present disclosure will be described. FIG. 14 is a schematic diagram of the substrate processing apparatus according to the second embodiment.

The substrate processing apparatus 1A according to the second embodiment is different from the substrate processing apparatus 1 according to the first embodiment shown in FIG. 1 in that it includes three pressure detection parts 110a, 110b and 110c. Since other configurations are the same as those of the substrate processing apparatus 1 according to the first embodiment, descriptions of the same configurations as those of the substrate processing apparatus 1 according to the first embodiment will be omitted, and different configurations will be described.

In the second embodiment, three pressure detection parts 110a, 110b and 110c are provided in the manifold 54. The respective pressure detection parts 110a, 110b and 110c include sensor tubes 112a, 112b and 112c made of quartz. The sensor tubes 112a, 112b and 112c are provided in the inner tube 44 to extend along the longitudinal direction of the inner tube 44. Base end portions of the sensor tubes 112a, 112b and 112c are bent in an L-like shape and are supported so as to penetrate the manifold 54. Second vacuum gauges 114a, 114b and 114c such as Baratron sensors or the like for detecting the pressures inside the sensor tubes are attached to the sensor tubes 112a, 112b and 112c and are configured to be able to detect the internal pressures of the sensor tubes 112a, 112b and 112c.

The tips of the sensor tubes 112a, 112b and 112c are respectively located at the lower part, the central part and the upper part of the inner tube 44. Thus, by detecting the pressure inside the sensor tubes 112a, 112b and 112c with the second vacuum gauges 114a, 114b and 114c, it is possible to detect the pressures in the lower part, the central part and the upper part of the inner tube 44. That is, since the pressure fluctuation in the inner tube 44 can be directly detected, even when the ratio of the pressure inside the inner tube 44 to the pressure inside the exhaust passage 86 changes, it is possible to detect the pressure inside the inner tube 44 with high accuracy.

In particular, in the substrate processing apparatus 1A according to the second embodiment, since the pressures in the lower part, the central part and the upper part of the inner tube 44 can be detected, it is possible to acquire the relationship between the rotation angle of the movable wall 100 and the pressure inside the inner tube 44 with particularly high accuracy.

While the embodiments for carrying out the present disclosure have been described above, the above contents are not intended to limit the contents of the present disclosure. Various modifications and improvements may be made within the scope of the present disclosure.

In the above-described embodiments, there has been described the form in which the movable wall 100 is provided along the inner wall of the inner tube 44. However, the present disclosure is not limited thereto. For example, the movable wall 100 may be provided between the inner tube 44 and the outer tube 46. In this case, the movable wall 100 is provided along the outer wall of the inner tube 44.

In the above-described embodiments, there has been described a film forming process that does not use plasma. However, the present disclosure is not limited thereto. The present disclosure may also be applied to a case where a film forming process is performed using plasma. In this case, for example, plasma is generated by providing a power plate for applying high frequency power for plasma generation on the outer side of the partition wall of the convex portion 50 defining the nozzle accommodating portion 48 along the longitudinal direction thereof.

In the above-described embodiment, a semiconductor wafer has been described as an example of the substrate. However, the semiconductor wafer may also include a silicon substrate and a semiconductor substrate of a compound such as GaAs, SiC and GaN. Further, the present disclosure is not limited to these substrates and may also be applied to a glass substrate used in a liquid crystal display device, a ceramic substrate, or the like.

According to the substrate processing apparatus of the present disclosure, it is possible to control inter-plane uniformity.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus, comprising:
   an inner tube configured to accommodate a plurality of substrates and having a side wall, a flat ceiling portion covering a top of the inner tube, and a first opening portion formed in the side wall along a longitudinal direction of the inner tube;
   an outer tube surrounding the inner tube;
   a movable wall movably provided in the inner tube or between the inner tube and the outer tube and having a second opening portion;
   a gas supplier configured to supply a processing gas into the inner tube;
   an exhauster provided outside the movable wall and configured to exhaust the processing gas supplied into the inner tube through the first opening portion and the second opening portion;
   a pressure detector including one or more sensor tubes provided in the inner tube and one or more vacuum gauges configured to detect a pressure inside the inner tube; and
   a controller configured to detect a position of the movable wall and to control a movement of the movable wall based on a relationship between the position of the movable wall and the pressure inside the inner tube detected by the pressure detector,
   wherein when the pressure inside the inner tube detected by the pressure detector changes from a substantially constant value and the position of the movable wall detected by the controller is different from a predetermined first position, the controller is further configured to correct the position of the movable wall so as to come up to the predetermined first position, and
   wherein the first opening portion is different in shape from the second opening portion.

2. The apparatus of claim 1, wherein the one or more sensor tubes have one end of the one or more sensor tubes communicating with the inside of the inner tube and the one or more vacuum gauges are configured to detect pressures inside the one or more sensor tubes.

3. The apparatus of claim 2, wherein the one or more sensor tubes are configured to allow a gas to flow through the one or more sensor tubes.

4. The apparatus of claim 1, wherein the exhauster includes a pressure regulator configured to regulate the pressure inside the inner tube.

5. The apparatus of claim 4, wherein the controller is configured to control the pressure regulator.

6. The apparatus of claim 5, wherein when the pressure inside the inner tube is different from a predetermined pressure and the movable wall detected by the controller is in a second position, the controller is further configured to correct the pressure inside the inner tube, so as to come close to the predetermined pressure.

7. The apparatus of claim 6, wherein the second position is a position at which an area where the first opening portion and the second opening portion overlap with each other is the largest or smallest.

8. The apparatus of claim 1, wherein a common opening portion is formed where the first opening portion and the second opening portion overlap with each other, and
   a width of an upper side of the common opening portion is different from a width of a lower side of the common opening portion when the first opening portion and the second opening portion overlap by a predetermined width.

9. The apparatus of claim 1, wherein the one or more sensor tubes provided in the inner tube are respectively located at different heights with respect to the longitudinal direction of the inner tube.

* * * * *